(12) United States Patent
Vereecken et al.

(10) Patent No.: US 8,114,770 B2
(45) Date of Patent: Feb. 14, 2012

(54) PRE-TREATMENT METHOD TO INCREASE COPPER ISLAND DENSITY OF CU ON BARRIER LAYERS

(75) Inventors: Philippe M. Vereecken, Liége (BE); Aleksandar Radisic, Leuven (BE)

(73) Assignee: IMEC, Leuven (BE)

( * ) Notice: Subject to any disclaimer, the term of this patent is extended or adjusted under 35 U.S.C. 154(b) by 135 days.

(21) Appl. No.: 12/764,721

(22) Filed: Apr. 21, 2010

(65) Prior Publication Data
US 2010/0273323 A1 Oct. 28, 2010

Related U.S. Application Data

(60) Provisional application No. 61/172,131, filed on Apr. 23, 2009.

(51) Int. Cl.
*H01L 21/4763* (2006.01)
(52) U.S. Cl. ........................................ 438/650; 438/686
(58) Field of Classification Search .................. 438/637, 438/643, 672, 650, 686
See application file for complete search history.

(56) References Cited

U.S. PATENT DOCUMENTS

| 4,445,980 | A | 5/1984 | Smith | |
|---|---|---|---|---|
| 7,405,157 | B1 * | 7/2008 | Reid et al. | 438/677 |
| 2004/0173465 | A1 | 9/2004 | Burca et al. | |
| 2006/0063375 | A1 * | 3/2006 | Sun et al. | 438/629 |
| 2006/0079083 | A1 * | 4/2006 | Baskaran et al. | 438/652 |
| 2006/0189129 | A1 | 8/2006 | Baskaran et al. | |

OTHER PUBLICATIONS

Moffat, T.P., et al. Electrodeposition of Cu on Ru Barrier Layers for Damascene Processing, Journal of The Electrochemical Society, 153 (1) C37-C50 (2006).

* cited by examiner

*Primary Examiner* — Jenny L Wagner
(74) *Attorney, Agent, or Firm* — Knobbe Martens Olson & Bear LLP

(57) ABSTRACT

A method for producing on-chip interconnect structures on a substrate is provided, comprising at least the steps of providing a substrate and depositing a ruthenium-comprising layer on top of said substrate, and then performing a pre-treatment of the Ru-comprising layer electrochemically with an $HBF_4$-based electrolyte, and then performing electrochemical deposition of copper onto the pre-treated Ru-comprising layer.

20 Claims, 8 Drawing Sheets

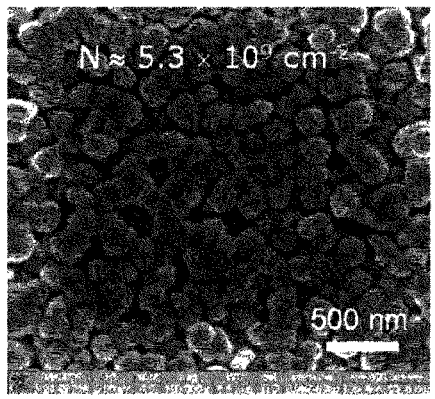
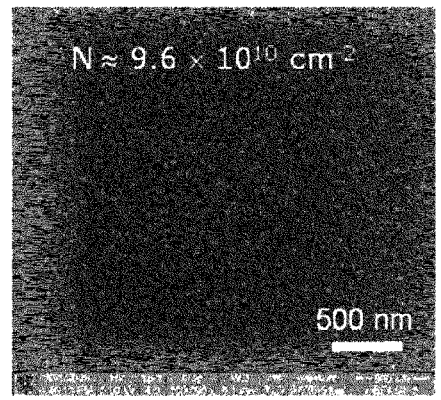
FIG. 1A
FIG. 1B
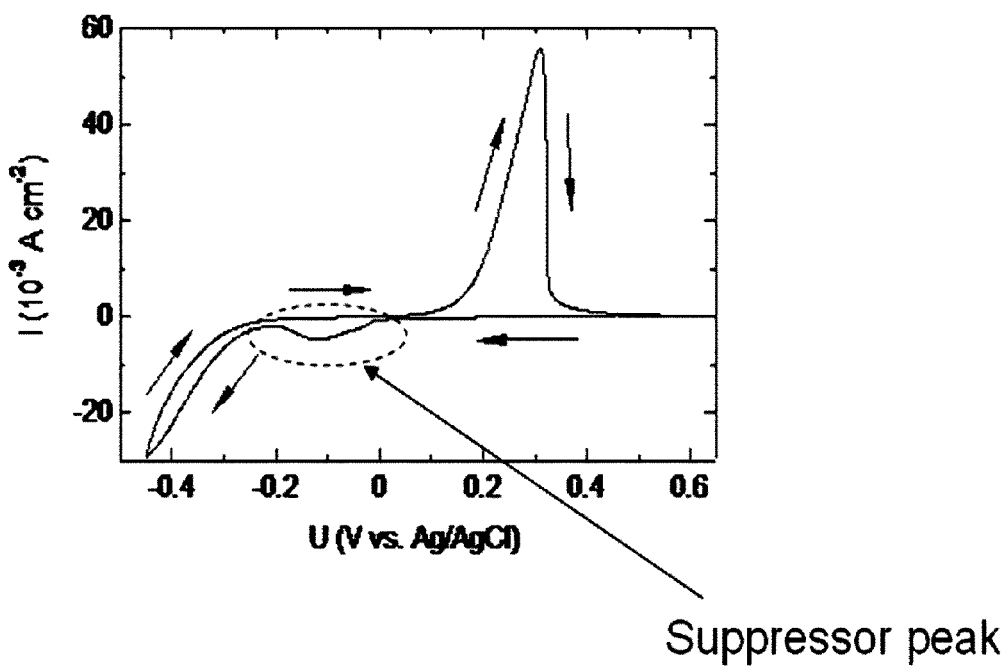
FIG. 2

PRE-TREATMENT METHOD TO INCREASE COPPER ISLAND DENSITY OF CU ON BARRIER LAYERS

CROSS-REFERENCE TO RELATED APPLICATION

This application claims the benefit under 35 U.S.C. §119 (e) of U.S. provisional application Ser. No. 61/172,131, filed Apr. 23, 2009, the disclosure of which is hereby expressly incorporated by reference in its entirety and is hereby expressly made a portion of this application.

FIELD OF THE INVENTION

Methods for the production of interconnect structures in integrated circuits are provided, in particular methods involving copper plating onto Ruthenium-comprising barrier layers. A method for improving the electrochemical deposition and adhesion of copper onto a barrier layer comprising Ruthenium and Tantalum is provided.

BACKGROUND OF THE INVENTION

There is an on-going trend towards smaller on-chip interconnect wiring dimensions, especially in terms of the width of the interconnect structures which are evolving towards less than 50 nm. Consequently, a constant need for improved copper plating techniques exists. Interconnect structures are typically formed by filling trenches or holes in a dielectric layer, wherein these trenches or holes are first lined with a barrier layer, and possibly a seed layer. The barrier layer prevents migration of Cu into the surrounding dielectric, whereas the seed layer is often necessary as a consequence of poor nucleation of Cu onto the barrier layer.

For the barrier layer, Tantalum has been used. The seed layer is often a physically or chemically deposited Cu layer. The insufficient thermal and electrical conductivity of Ta however, and the search for barrier layers that do not require a separate seed layer, but which allow directly depositing a Cu layer (in other words combined barrier/seed layers), has led to alternatives for Tantalum.

In 'Electrodeposition of Cu on Ru barrier layers for damascene processing', Moffat et al., Journal of Electrochemical Society, 153(1) C37-050 (2006), a method for directly electroplating Cu onto a Ruthenium barrier layer is described. The removal of oxides from the Ru-layer is described as a necessary pre-treatment step, possibly by treating the Ru-layer with a deaerated sulphuric acid solution.

Cu plating on the barrier/seed layers occurs through nucleation and growth of Cu islands on top of the Ru or RuTa barrier/seed layer, which coalesce into a continuous Cu film. Achieving a high copper island density is extremely important in Cu plating of narrow lines (<50 nm or <32 nm) and other small features, where extremely high island density ($>10^{11}$ cm$^{-2}$) is needed to achieve defect-free fill. In order to plate Cu films less than 15 nm thick, and fill the narrow lines, one has to have a good control over Cu island density, i.e. extremely high Cu island densities are needed. The island density may be influenced by adjusting parameters such as current (potential), bath composition, concentration of additives, etc., but also by modifying the substrate properties. For example, as stated with reference to the article by Moffat et al., removing a thin oxide film from a Ruthenium surface has a strong effect on Cu plating, and increases Cu island density. However, in the case of RuTa surfaces, the commonly used approach of forming-gas-anneal (FGA=anneal with $H_2/N_2$: e.g. 10% $H_2$ in $N_2$) does not improve RuTa substrate properties enough. Also, electrolytic "cleaning" with $H_2SO_4$ does not improve the RuTa surface enough, since $H_2SO_4$ has no effect on Ta.

Thus, plating high Cu island density on Ru-comprising surfaces of substrates, in particular RuTa surfaces, with good adhesion between Cu film and RuTa layers is still challenging, and further improvements in the pre-treatment methods and other aspects of metallization technology are needed.

SUMMARY OF THE INVENTION

A suitable treatment to improve electrochemical deposition (also referred to as plating) of copper onto Ruthenium-comprising layers, more specifically onto barrier layers comprising Ruthenium and Tantalum or comprising a RuTa alloy and achieving a high copper nucleus density ($>10^{11}$ cm$^{-2}$), hereafter referred to as 'island density', onto said Ru-comprising layers is desirable. All layers comprising Ru and Ta or comprising a RuTa alloy (i.e. an alloy comprising or consisting of alloying elements Ru and Ta) are hereafter referred to as 'RuTa layers'.

The preferred embodiments are related to methods as disclosed in the appended claims. The preferred embodiments are thus related to a method for producing on-chip interconnect structures on a substrate, comprising at least the steps of:

Providing a substrate and depositing a Ruthenium-comprising layer on top of said substrate, and then Performing a pre-treatment of the Ru-comprising layer electrochemically with an $HBF_4$-based electrolyte, and then Performing electrochemical deposition of copper onto the pre-treated Ru-comprising layer.

Said Ru comprising layer is preferably a layer comprising a Ruthenium alloy. Said alloy preferably comprises Ruthenium and one of the following components: Ta, Ti, TiN, TaN. Said alloy may be a RuTa alloy having a ratio of Ru towards Ta (Ru/Ta) of 3 up to 9.

According to an embodiment, the thickness of said Ru comprising layer is 2 nm up to 5 nm. The Ru comprising layer may be deposited using Plasma Vapour Deposition.

Said substrate may comprise patterned structures such as narrow lines, vias and/or trenches having a width smaller than 50 nm.

Said electrochemical pre-treatment may be performed using one of the following electrochemical techniques: the cyclic voltammetric method, the potentiostatic (constant voltage) method or the galvanostatic (constant current) method.

According to an embodiment, said electrochemical pre-treatment is performed using Cyclic Voltammetry (CV), starting from open circuit potential (OCP) towards negative potentials, and reversed at −0.45 V, and then stopped at −0.32 V.

According to another embodiment, said electrochemical pre-treatment is performed using a Galvanostatic clean performed at a constant current within the range of −0.1 mA/cm$^2$ up to −100 mA/cm$^2$ and applied for a period of time corresponding to a charge in the range of −10 mC/cm$^2$ up to −10 C/cm$^2$, preferably between −100 mC/cm$^2$ and −1 C/cm$^2$ and most preferably between −400 mC/cm$^2$ and −800 mC/cm$^2$.

According to another embodiment, said electrochemical pre-treatment is performed using a Potentiostatic clean performed at a constant voltage corresponding with a potential between −0.27V and −0.8V as referenced to a Ag/AgCl reference electrode which is applied for a period of time corresponding to a charge in the range of −10 mC/cm$^2$ up to −10

$C/cm^2$, preferably between $-100$ $mC/cm^2$ and $-1$ $C/cm^2$ and most preferably between $-400$ $mC/cm^2$ and $-800$ $mC/cm^2$.

Said $HBF_4$-based electrolyte is preferably applied in the form of an aqueous bath having a concentration of $HBF_4$ in the range of 0.05 wt. % $HBF_4$ (1 ml/L) up to 50 wt. % (concentrated), more preferably in the range of 1 wt. % (20 ml/l) and 10 wt. % (200 ml/L) and most preferably in the range of 2 wt. % and 3 wt. % (40 ml/L and 60 ml/L).

One or more additives may be added to the $HBF_4$-based electrolyte, said additive(s) being selected from the following: $H_2SO_4$, a wetting agent, a surfactant, a pH controlling agent.

BRIEF DESCRIPTION OF THE DRAWINGS

All figures are intended to illustrate some aspects and preferred embodiments. The figures are depicted in a simplified way for reason of clarity. Not all alternatives and options are shown and therefore the invention is not limited to the content of the given drawings. Like numerals are employed to reference like parts in the different figures.

FIG. 1 illustrates the density of Cu plated islands on RuTa layers without pre-treatment of the RuTa substrate (FIG. 1A) and with pre-treatment of the RuTa substrate electrochemically with an $HBF_4$-based electrolyte according to preferred embodiments (FIG. 1B). The Cu is plated using constant current density $i=-5$ $mA/cm^2$.

FIG. 2 illustrates a current-voltage (CV) curve with the Cu Suppressor peak indicated on the graph, for a non-pre-treated RuTa layer.

DETAILED DESCRIPTION OF THE PREFERRED EMBODIMENT

Figure 3A:
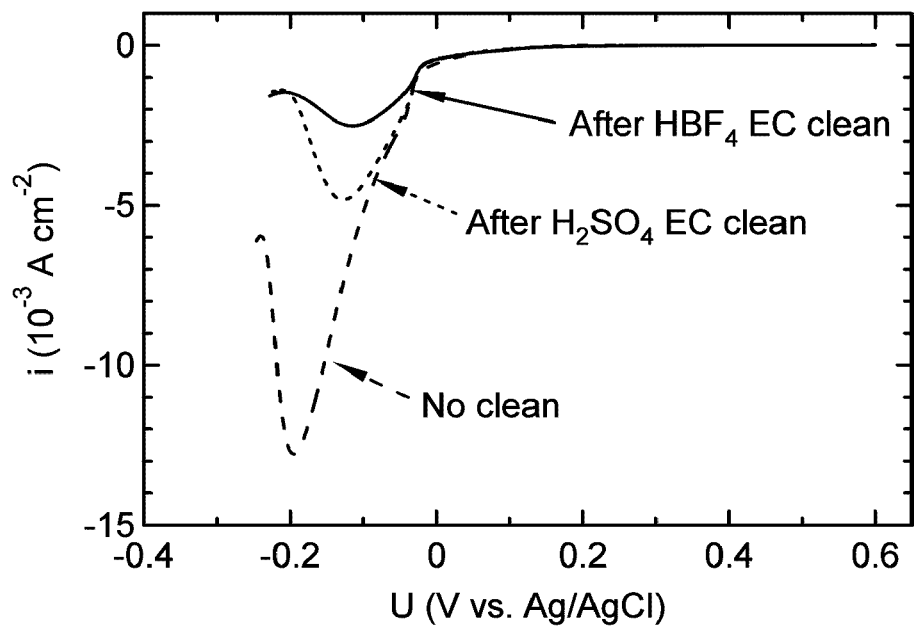
FIG. 3A illustrates a current-voltage curve monitored during Cu plating on RuTa layers without pre-treatment, with pre-treatment of the RuTa layer electrochemically with an $H_2SO_4$-based and with pre-treatment of the RuTa layer electrochemically with an $HBF_4$-based electrolyte.

The preferred embodiments are related to a method for producing on-chip interconnect structures, comprising at least the steps of:
  Providing a substrate and depositing a Ruthenium-comprising layer on top of said substrate, and then
  Performing a pre-treatment of the Ru-comprising layer electrochemically with an $HBF_4$-based electrolyte, and then
  Performing electrochemical deposition of copper onto the pre-treated Ru-comprising layer.

The methods of preferred embodiments allows the density of Cu plated islands ($>10^{11}$ $cm^{-2}$) on Ru comprising layers to be increased and Cu adhesion to said layers to be improved.

According to preferred embodiments said substrate comprises patterned structures such as narrow lines, vias and/or trenches having a width <50 nm.

The method is related to Ru-comprising layers deposited on the substrate. Preferably, this concerns layers comprising or consisting of a Ruthenium alloy, more preferably an alloy comprising as alloying elements Ruthenium and one of the following: Ti, Ta, TiN and TaN. According to preferred embodiments, said Ru-comprising layer is a RuTa layer (as defined above).

According to preferred embodiments said Ru comprising layer, more specifically said RuTa layer needs to be as thin as possible, but still continuous in the patterned structures.

According to preferred embodiments said Ru comprising layer, more specifically said RuTa layer fulfils the role of a barrier layer and of a seedlayer, so no additional seed layer, e.g. a Cu seed layer is required. A seedlayer is needed in order to perform electrochemical deposition of copper, a barrier layer is needed to avoid diffusion of copper into the surrounding dielectricum of the copper structure.

According to preferred embodiments the thickness of said Ru comprising layer, more specifically said RuTa layer may be 2 nm up to 5 nm thick. The RuTa films may be deposited according to a known technique, e.g. using Plasma Vapour Deposition also referred to as Sputtering. To achieve a continuous coverage at the bottom of trenches and vias, additional steps may be needed such as e.g. a re-sputtering (etching) step in combination with a short (additional) PVD deposition step (flash) in order to avoid detrimental effects on plating.

According to preferred embodiments said RuTa layer has a ratio of Ru towards Ta (Ru/Ta) of 3 up to 9. The ratio of Ru towards Ta is such that improved barrier properties are obtained for the RuTa layer. Ru itself is known to exhibit good seedlayer properties to perform copper plating. Because Ru itself is not considered a good barrier layer it is alloyed with optimum concentrations of Ta (which is known to exhibit good barrier properties to avoid Cu diffusion into the surrounding Si material).

According to preferred embodiments said electrochemical pre-treatment of the substrate having a Ru comprising layer, more specifically a RuTa layer on top may be performed using one of the following known electrochemical techniques: the cyclic voltammetric method, the galvanostatic (constant current) method or the potentiostatic (constant voltage) method. In the following (except in the examples), any description given in relation to a 'RuTa layer' is valid for any Ru-comprising layer.

According to preferred embodiments said electrochemical pre-treatment of the RuTa layer is performed using Cyclic Voltammetry (CV). Typical CV scans start from the open circuit potential (OCP) towards negative potentials, and reversed at $-0.45$ V, and then stopped at $-0.32$ V. Charge integrated under cathodic part of the CV is typically $-200$ mC/cm$^2$. The onset potential in a forward scan at which cathodic current started increasing (being more negative) is typically about $-0.23$ V.

According to preferred embodiments said electrochemical pre-treatment of the RuTa layer is performed using a Galvanostatic clean (constant current during treatment). Said Galvanostatic method is also typically used in common plating tools to employ Cu plating. Said Galvanostatic pre-treatment (clean) is preferably performed at a constant current within the range of $-0.1$ mA/cm$^2$ up to $-100$ mA/cm$^2$, or within a range of $-1$ mA/cm$^2$ up to $-100$ mA/cm$^2$, typically said galvanostatic pre-treatment (clean) is performed at $-10$ mA/cm$^2$. The said galvanostatic pre-treatment may be applied for a period of time corresponding to a charge in the range of $-1$ mC/cm$^2$ up to $-10$ C/cm$^2$, preferably between $-10$ mC/cm$^2$ and $-1$ C/cm$^2$ and most preferably between $-100$ mC/cm$^2$ and $-500$ mC/cm$^2$. According to a preferred embodiment, the said galvanostatic pre-treatment is applied for a period of time corresponding to a charge in the range of $-10$ mC/cm$^2$ up to $-10$ C/cm$^2$, preferably between $-100$ mC/cm$^2$ and $-1$ C/cm$^2$ and most preferably between $-400$ mC/cm$^2$ and $-800$ mC/cm$^2$. The result is similar to that obtained using above mentioned Cyclic Voltammetry.

According to preferred embodiments, said electrochemical pre-treatment of the RuTa layer is performed using a Potentiostatic clean (constant voltage during treatment). Said Potentiostatic clean is typically performed at a constant voltage corresponding with a potential of the RuTa between $-0.27$V and $-0.8$V as referenced to an Ag/AgCl reference electrode. The said potentiostatic pre-treatment may be applied for a period of time corresponding to a charge in the range of $-1$ mC/cm$^2$ up to $-10$ C/cm$^2$, preferably between $-10$ mC/cm$^2$ and $-1$ C/cm$^2$ and most preferably between $-100$ mC/cm$^2$ and $-500$ mC/cm$^2$. According to a preferred embodiment, the said potentiostatic pre-treatment is applied for a period of time corresponding to a charge in the range of $-10$ mC/cm$^2$ up to $-10$ C/cm$^2$, preferably between $-100$ mC/cm$^2$ and $-1$ C/cm$^2$ and most preferably between $-400$ mC/cm$^2$ and $-800$ mC/cm$^2$. The result is similar to that obtained using above mentioned Cyclic Voltammetry and Galvanostatic clean.

According to preferred embodiments said HBF$_4$-based electrolyte is applied in the form of an aqueous bath with HBF$_4$, i.e. a solution comprising at least H$_2$O and HBF$_4$. Said aqueous bath with HBF$_4$ is preferably prepared using a dilution from commercial available tetrafluoroboric acid 48 wt %-50 wt % aqueous solutions. The concentration of HBF$_4$ in said bath is preferably in the range of 0.05 wt. % HBF$_4$ (1 ml/L) up to 50 wt. % (concentrated), more preferably between 1 wt. % (20 ml/l) and 10 wt. % (200 ml/L) and most preferably between 2 wt. % and 3 wt. % (40 ml/L and 60 ml/L).

According to preferred embodiments additives may be added to the HBF$_4$-based electrolyte. Said additives may comprise wetting agents, surfactants such as Polyethylene glycol (PEG) and pH controlling agents such as boric acid. Alternatively, another acid, such as H$_2$SO$_4$, can be used as an additive, and the concentration of HBF$_4$ reduced to make the "cleaning bath" more "tool-friendly", or to achieve better compatibility with the make-up of the current plating tools. In the cases where compatibility with the tool is not known, the bath formulation could be such that final concentrations are 0.1 wt. %-10 wt. % (0.02 M to 1.8 M) H$_2$SO$_4$ and 0.05 wt. %-2.5 wt. % HBF$_4$.

According to preferred embodiments direct plating of copper can be performed according to known methods, onto the pre-treated RuTa using typical acidic Cu-sulphate commercial baths. Said acidic Cu-sulphate baths preferably contain 17-60 g/L Cu (e.g. in the form of CuSO$_4$. 5H$_2$O), 10-180 g/L H$_2$SO$_4$ and 20-100 ppm chloride (Cl$^-$). Commercially available additives such as a suppressor, accelerator, and leveller may be added further to the plating bath to improve the copper quality and are commercially available e.g. from Rohm & Haas (Shipley). Typical copper sulphate based electroplating chemistries further comprise an organic polymer (e.g. polyethylene glycol (PEG)) as a suppressor additive, bis(sodiumsulfopropyl) disulfide (SPS) or similar molecule as an accelerator or brightening agent, and possibly an additional organic molecule that acts as a levelling agent to produce mirror-like plated surfaces. Typical commercially available additives are added to the Cu-sulphate baths in additions of 5 ml/L up to 15 ml/L, for the accelerator from 5 ml/L to 15 ml/L, and for the leveller more than 2 ml/L. However, actual concentrations will depend on the feature sizes, their aspect ratios, substrate (RuTa) properties, since the ultimate goal is to fill the features void-free.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

EXAMPLES

Example 1

Cu Plating on Non-Treated RuTa Layer (4 nm)

Copper is electrochemically deposited (plated) onto a substrate (a silicon wafer) with a non-treated 4 nm RuTa layer on top of said substrate. The Cu is plated by using a bath comprising a suppressor additive. The Cu plates onto the RuTa layer until most of the RuTa surface is covered with Cu islands. FIG. 2 illustrates a Current-Voltage (I-V) curve during Cu-plating with the Cu Suppressor peak indicated on the graph. The Cu Suppressor peak shown on FIG. 2 illustrates an important indication for the complete coverage of the RuTa surface with copper. The Cu plates on RuTa until most of the surface is covered with Cu. After most of the Cu covers the surface of the RuTa, the suppressor additive blocks further Cu deposition and the CV-curve shows a peak (indicated). At large over-potentials, the suppressor cannot block deposition efficiently and an increase in cathodic current (more negative current) is observed.

Example 2

Figure 3B:
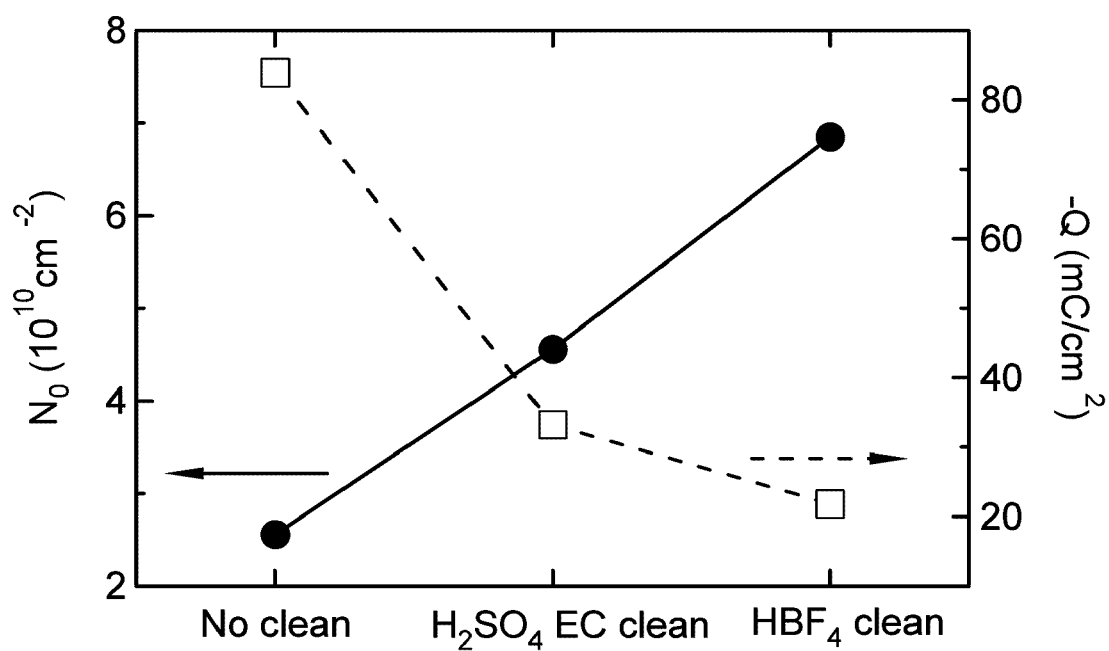
FIG. 3B illustrates the Cu island density after Cu plating on RuTa layers as well as the charge deposited, without pre-treatment, with pre-treatment of the RuTa substrate electrochemically with an $H_2SO_4$-based and with pre-treatment of the RuTa substrate electrochemically with an $HBF_4$-based electrolyte.

Cu Plating and Related Copper Island Density on $HBF_4$-Treated RuTa Layer (4 nm), Compared to $H_2SO_4$ Treated and Non-Treated RuTa Layer Cu nucleation and growth phenomena on RuTa alloys as a function of the surface pre-treatment were investigated using galvanostatic methods and RuTa wafer pieces of 2 by 2 $cm^2$ with plated area of 0.07 $cm^2$. It was found that the pre-treatment method of the preferred embodiments using $HBF_4$ leads to an increase in Cu island density, and hence resulting in a thinner continuous Cu film (the higher the island density the sooner they coalesce into continuous film, i.e. a thinner film is obtained). Copper island density for CV-s stopped at the maximum following the suppressor peak (shown in FIG. 3A) is illustrated in FIG. 3B.

Figures 3C, 3D, 3E:
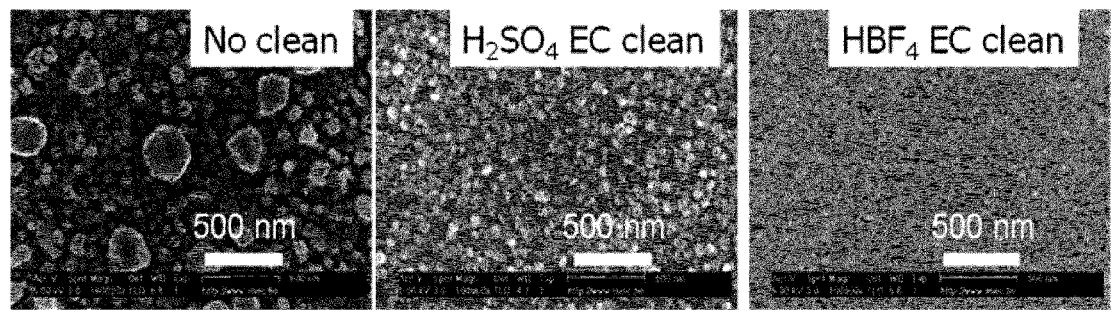
FIGS. 3C to 3E show SEM images of samples corresponding to the current-voltage curves plotted in FIG. 3A.

FIGS. 3C-3E illustrate SEM images of the Cu islands formed onto the RuTa surface (just after the end of the Suppressor peak). FIG. 3C illustrates the density of Cu plated islands on RuTa layers without pre-treatment. FIG. 3D illustrates the density of Cu plated islands on RuTa layers with pre-treatment of the RuTa substrate electrochemically with an $H_2SO_4$-based electrolyte. FIG. 3E illustrates the density of Cu plated islands on RuTa layers with pre-treatment of the RuTa substrate electrochemically with an $HBF_4$-based electrolyte according to preferred embodiments.

Example 3

Cu Plating on $HBF_4$-Treated RuTa Layer (4 nm) as a Function of Pre-Treatment Time Copper is electrochemically deposited (plated) onto a substrate (a Si wafer) with a 4 nm RuTa layer on top of said substrate. Different samples are prepared having RuTa layers on top which have been pre-treated with $HBF_4$ according to the preferred embodiments with different exposure times (Galvanostatic clean at −10 mA/cm2).

Figure 4A:
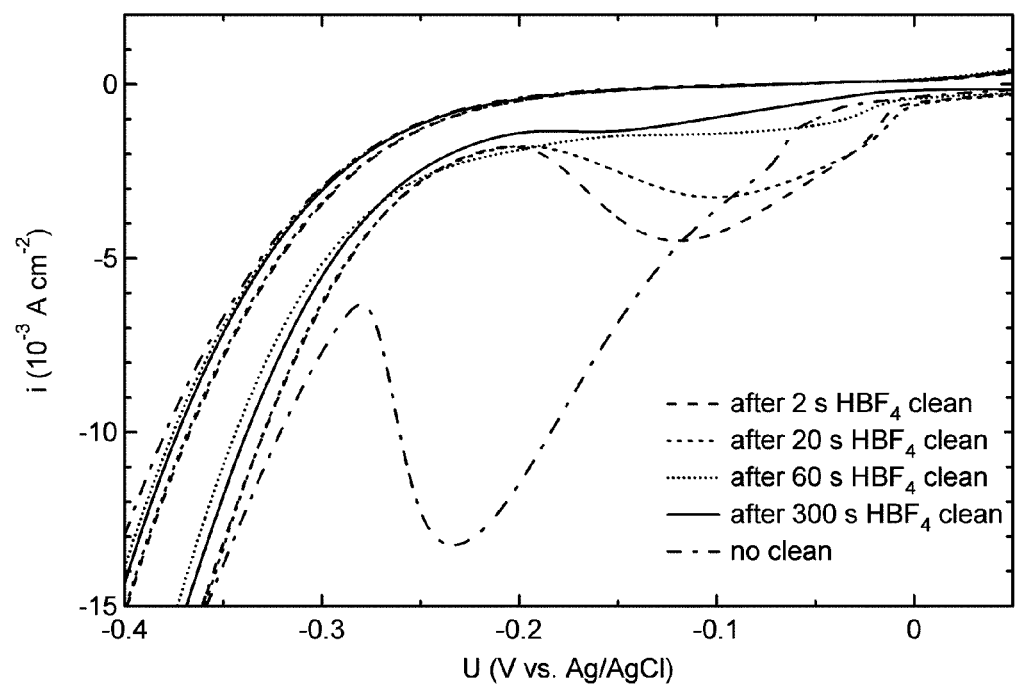
FIG. 4a illustrates different CV curves monitored during Cu plating on RuTa layers without pre-treatment and with pre-treatment of the RuTa substrate electrochemically with an $HBF_4$-based electrolyte and wherein the $HBF_4$ pre-treatment is applied for different times at $i=-10$ $mA/cm^2$.

FIG. 4a thus illustrates different CV curves monitored during Cu plating on RuTa layers without pre-treatment and with pre-treatment of the RuTa substrate electrochemically with an $HBF_4$-based electrolyte and wherein the $HBF_4$ pre-treatment is applied for different times at i=−10 mA/$cm^2$. The different pre-treatment times range from 0 seconds (no clean), 2, 5, 10, 20, 30, 60, up to 300 seconds. A significant change in the Cu suppressor peak is observed after 2 seconds and the longer the pre-treatment, the smaller the Cu suppressor peak is.

Figure 4B:
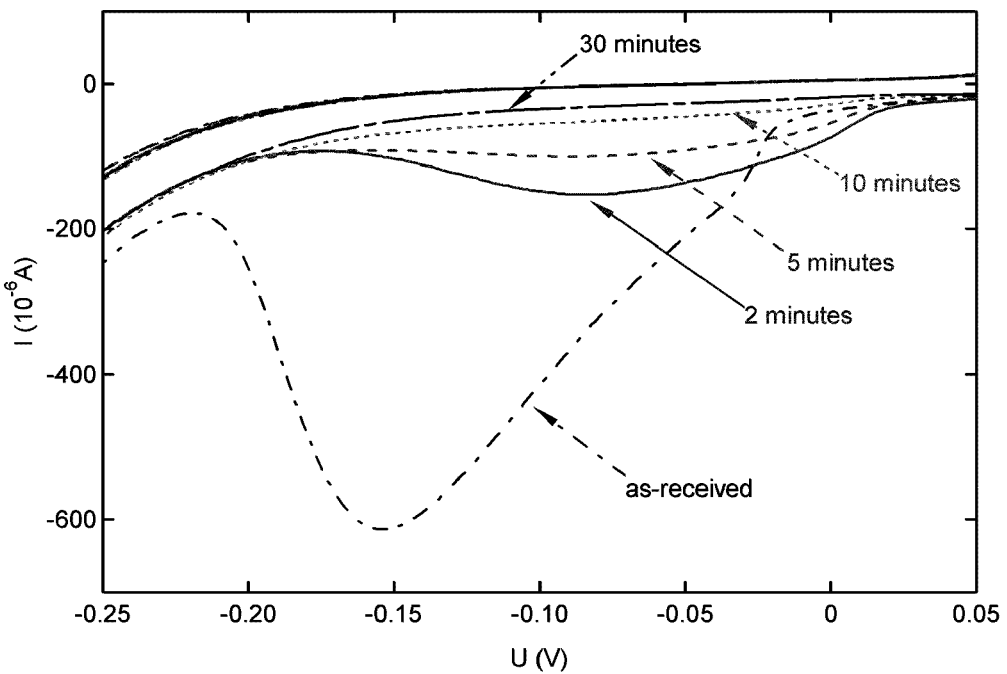
FIG. 4b shows the cyclic voltammograms (CV) recorded after EC clean using 50 ml/L $HBF_4$ at $-0.1$ $mA/cm^2$ 2, 5, 10 and 30 min, and the reference CV recorded on the as-received RuTa substrate. The area of the electrode was 0.07 $cm^2$.
Figure 4C:
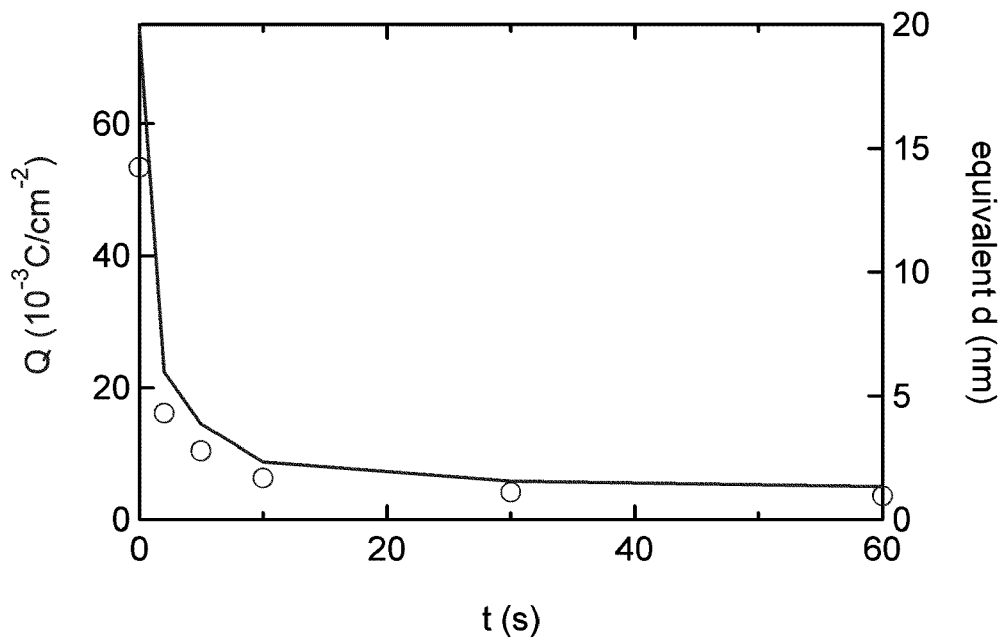
FIG. 4c shows the charge and effective Cu film thickness calculated from the area under the S-peak in the cyclic voltammograms.

The effect of cleaning time on the plating results was also explored using pretreatment at i=−0.1 mA/$cm^2$ for 2, 5, 10, 30, 60 min in $HBF_4$ bath. The results were compared to a reference sample that received no treatment. Cu plating solution was 250 mM $CuSO_4.5H_2O$, 100 ml/l $H_2SO_4$, 1.4 mM HCl, and 10 ml/l S-2001. Comparison was performed using CV-s, and then checking the charge under Cu-Sup peak. FIG. 4b shows the CV-s for different cleaning times and the reference (non-cleaned sample). After 30 minutes, the results become indistinguishable, and plot for 60 minute clean is not shown in the plot for improved clarity. FIG. 4c shows the effective Cu thickness and charge under the Cu-Sup peak for different cleaning times. The longer the clean the smaller the effective Cu thickness is.

Example 4

Cu Plating on $H_2SO_4$ and $HBF_4$-Treated RuTa Layer (4 nm) as a Function of Applied Current During Electrochemical Pre-Treatment Copper is electrochemically deposited (plated) onto a substrate (Si wafer) with a 4 nm RuTa layer on top of said substrate. Different samples are prepared having RuTa layers on top which have been pre-treated with $HBF_4$ according to the preferred embodiments with different currents applied as shown in FIG. 5.

Figure 5A:
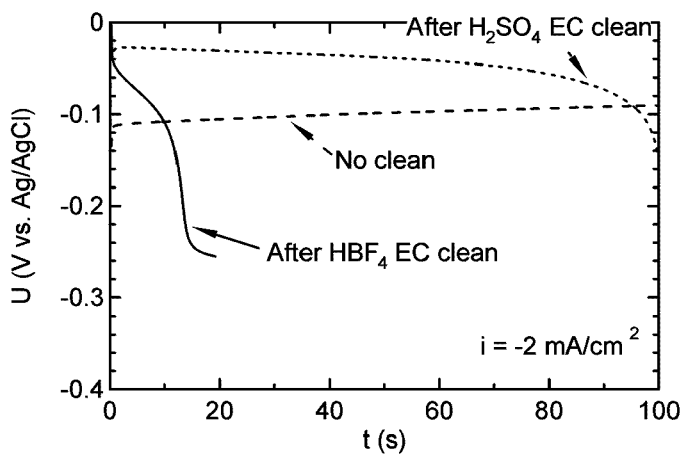
FIG. 5 illustrates different potential-time (U-t) curves monitored during Cu plating on RuTa layers without pre-treatment, with pre-treatment of the RuTa substrate electrochemically with an $H_2SO_4$-based electrolyte and with pre-treatment of the RuTa substrate electrochemically with an $HBF_4$-based electrolyte and wherein the different currents are applied during the electrochemical deposition. They were pre-treated using the same cyclic voltammetry scan (method). The applied deposition current density was $i=-2$ $mA/cm^2$ (FIG. 5A), $-5$ $mA/cm^2$ (FIG. 5B), up to $-10$ $mA/cm^2$ (FIG. 5C).
Figure 5B:
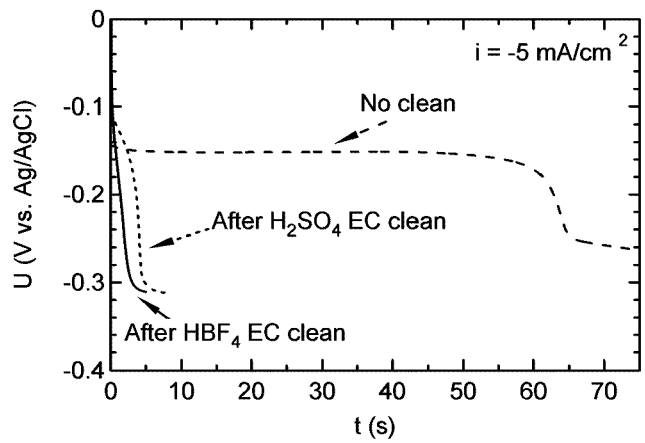
Figure 5C:
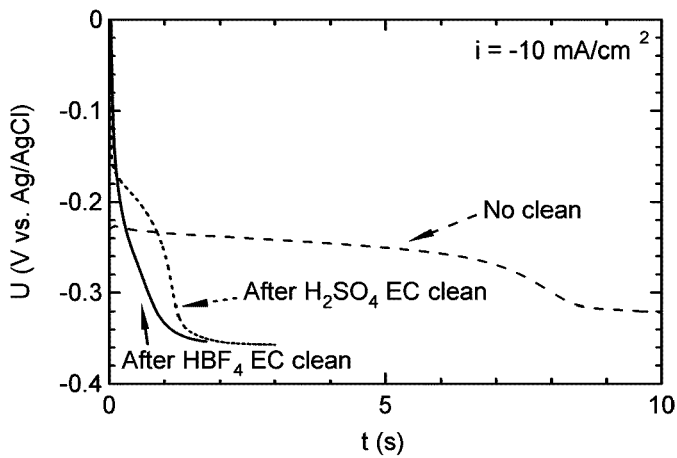

FIG. 5 illustrates different potential-time (U-t) curves monitored during Cu plating on RuTa layers without pre-treatment, with pre-treatment of the RuTa substrate electrochemically with an $H_2SO_4$-based electrolyte and with pre-treatment of the RuTa substrate electrochemically with an $HBF_4$-based electrolyte. Electrochemical deposition of copper was performed using the galvanostatic (constant current) method and the current density was: i=−2 mA/$cm^2$ (FIG. 5A), −5 mA/$cm^2$, (FIG. 5B) up to −10 mA/$cm^2$ (FIG. 5C).

Figure 6:
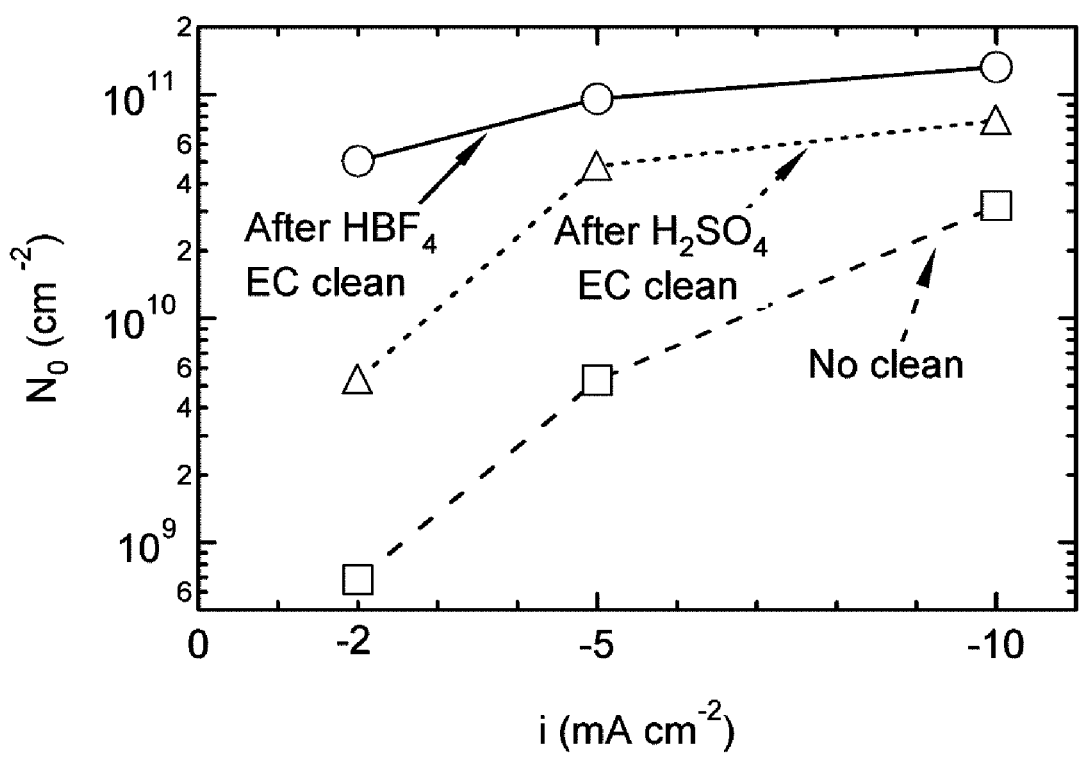
FIG. 6 illustrates the Cu island density versus current density for the different types of pre-treatment (clean).

FIGS. 5A-5C show significant differences in electrochemical responses during plating on RuTa substrates that are pre-treated in different ways. These U-t responses suggest that there are differences in Cu island densities between the samples, too. This is confirmed by an ex-situ SEM inspection, and island counting using image-analysis software. FIG. 6 shows Cu island density as a function of applied current density, and RuTa pre-treatment. The highest island density is achieved after the $HBF_4$ pre-treatment, while the lowest island density is obtained for as-received (non-treated) RuTa substrates.

Example 5

The Effect of Different $HBF_4$ Concentration

Figure 7A:
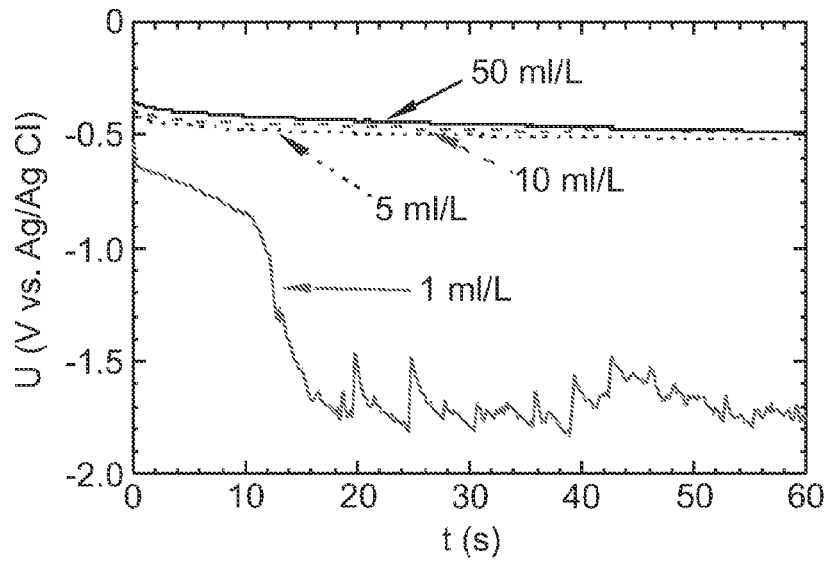
FIG. 7A shows the Potential-time responses recorded during the pre-treatment step according to the preferred embodiments, with 1 ml/L, 5 ml/L, 10 ml/L, and 50 ml/L $HBF_4$ at $-10$ $mA/cm^2$ for 60 seconds.
Figure 7B:
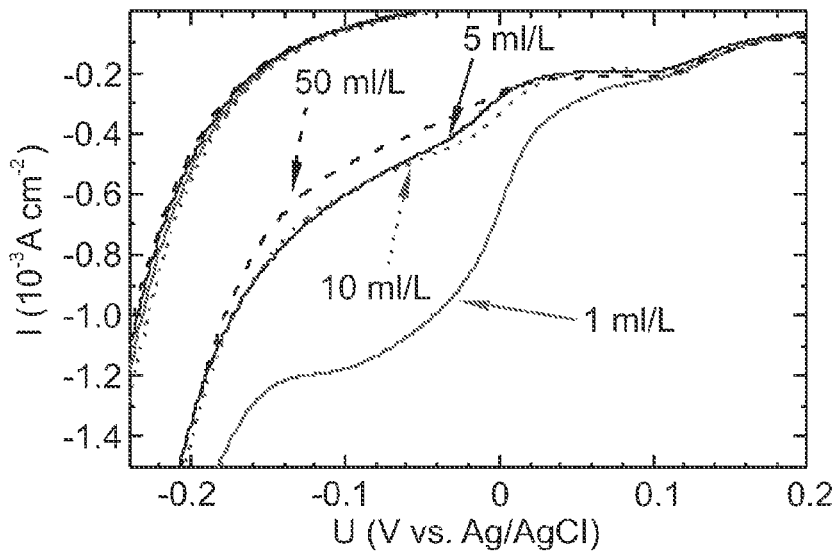
FIG. 7B shows cyclic voltammograms in a Cu plating bath after electromechanical pre-treatment using different $HBF_4$ concentrations (EC treatment at $-10$ $mA/cm^2$ for 60 seconds).
Figure 7C:
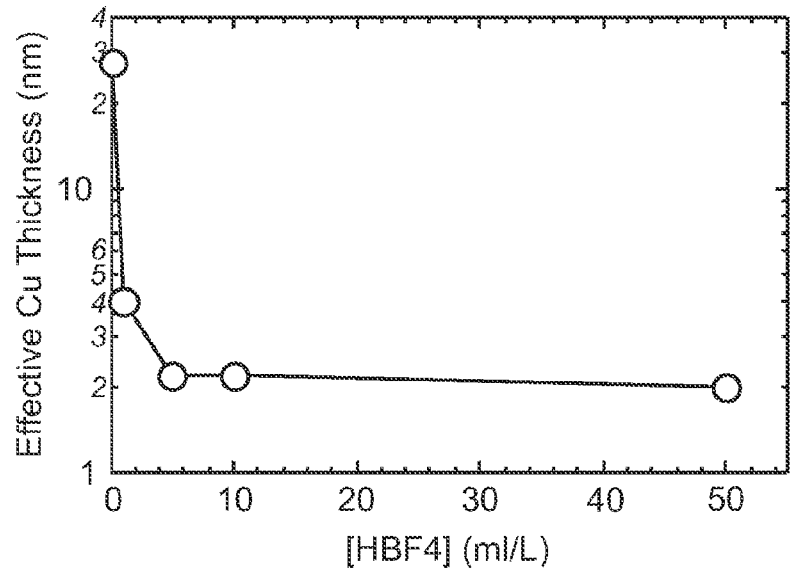
FIG. 7C shows the effective Cu film thickness versus $HBF_4$ concentration used for EC pre-treatment at $-10$ $mA/cm^2$ for 60 seconds. Non-treated (as received) 10 nm RuTa sample is designated 0 ml/L value on the X-axis.

The effect of HBF4 concentration on Cu plating was tested using 10 nm thick RuTa layers on blanket substrates. Electrochemical clean in $HBF_4$ was performed at −10 mA/$cm^2$ for 60 seconds (galvanostatic). $HBF_4$ concentration was 1 ml/L $HBF_4$, 5 ml/L $HBF_4$, 10 ml/L $HBF_4$, 50 ml/L $HBF_4$. Cyclic Voltammetry (CV) was used to determine the cleaning efficiency. The Cu bath contained 240 mM $CuSO_4.5H_2O$, 100 ml/l $H_2SO_4$, 1.4 mM HCl, and 15 ml/L S2001 suppressor additive. The ramp rate was 20 mV/s. FIG. 7A shows potential-time (U-t) response during clean at −10 mA/$cm^2$ using different $HBF_4$ concentrations. The U-t response for 1 ml/L [HBF4] stands out due to the fact that the potential is more negative than for the other 3 concentrations, and that there is a jump to even more negative potential after 10 seconds. The U-t response after 10 seconds becomes noisy, and it is likely that cleaning efficiency is seriously affected. FIGS. 7B and 7C confirm this, and within the experimental conditions defined above, higher [$HBF_4$] show superior results.

Example 6

Figure 8A:
FIG. 8A shows a schematic identification of coupons/positions that were used to test the electrochemical pre-treatment according to the preferred embodiments on wafer-level. #1 and #14 are coupons obtained from the edge of the wafer, where #1 comes from the notch, and #14 comes from the opposite wafer edge along the radius. #7 and #8 are coupons closest to the centre of the wafer
Figure 8B:
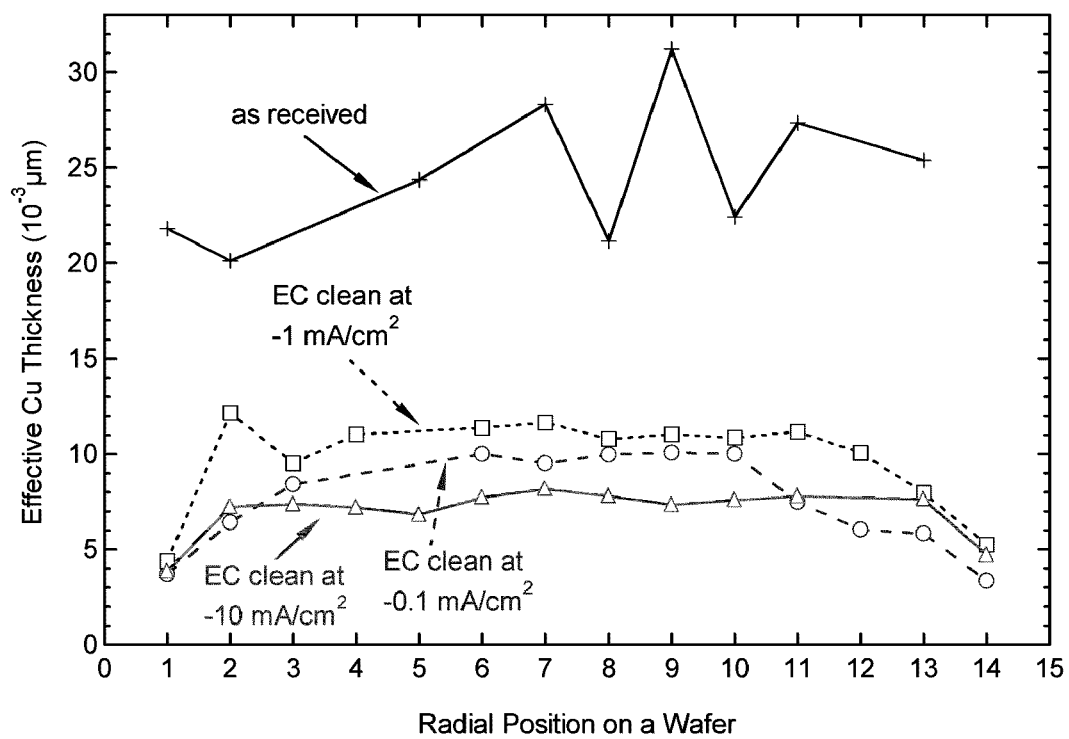
FIG. 8B shows the effective Cu thickness versus position along the radius of the wafer.

Pre-Treatment on a Wafer Scale with Different Current Densities, but with the Same Total Charge-Time Delay Effect on Plating After Clean EC pre-treatment with 50 ml/L $HBF_4$ aqueous solution was tested on 300 mm silicon wafers with 10 nm thick RuTa. Wafers were cleaned by applying current density (galvanostatic) of $-0.1$ $mA/cm^2$, $-1$ $mA/cm^2$, and $-10$ $mA/cm^2$ until the total charge used during the experiment was $-600$ $mC/cm^2$. The wafers were taken out of the plating tool and approximately 2 cm wide line along the radius was cleaved from the wafer. This line was further cleaved into coupons approximately 2.1 cm long (FIG. 8A). Each coupon was used sequentially, but positions chosen at random, in a setup that exposed only 0.07 $cm^2$ of the EC cleaned substrate to the Cu bath. The Cu bath contained basic Cu-sulphate electrolyte with 15 ml/L commercial suppressor S2001. The extent of EC clean was tested by running cyclic voltammograms at 20 mV/s. The area under the Cu-Sup peak was used to calculate the effective Cu film thickness, and compared to the same result obtained on as-received (non-pre-treated) 300 mm wafer with 10 nm RuTa. FIG. 8B shows plots of the effective Cu film thickness versus position on the 300 mm wafer and the current density used during the clean. In all cases the plating on pre-treated wafer was improved by the EC pre-treatment with $HBF_4$. The effective thickness of the plated Cu film dropped by more than 10 nm regardless of the current density used to EC clean the 10 nm RuTa. It is also worth noting that the last coupon was tested approximately 60 minutes after the wafer was taken out of the plating tool, but this had no influence on the plating results.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein.

Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for producing on-chip interconnect structures on a substrate, comprising:
providing a substrate and depositing a ruthenium-comprising layer on top of the substrate; thereafter
performing an electrochemical pre-treatment of the ruthenium-comprising layer with an $HBF_4$-based electrolyte; and thereafter
performing electrochemical deposition of copper onto the pre-treated ruthenium-comprising layer.

2. The method according to claim 1 wherein the ruthenium-comprising layer is a layer comprising a ruthenium alloy.

3. The method according to claim 2, wherein the alloy comprises ruthenium and at least one component selected from the group consisting of Ta, Ti, TiN, and TaN.

4. The method according to claim 3, wherein the alloy is a RuTa alloy having a ratio of Ru towards Ta (Ru/Ta) of from 3 to 9.

5. The method according to claim 1, wherein a thickness of the ruthenium-comprising layer is from 2 nm to 5 nm.

6. The method according to claim 1, wherein the ruthenium-comprising layer is deposited using plasma vapor deposition.

7. The method according to claim 1, wherein the substrate comprises patterned structures.

8. The method according to claim 7, wherein the patterned structures are selected from the group consisting of narrow lines, vias, and trenches having a width smaller than 50 nm, and combinations thereof.

9. The method according to claim 1, wherein the electrochemical pre-treatment is performed using at least one electrochemical technique selected from the group consisting of a cyclic voltammetric method, a potentiostatic (constant voltage) method, and a galvanostatic (constant current) method.

10. The method according to claim 9, wherein the electrochemical pre-treatment is performed using cyclic voltammetry starting from open circuit potential towards negative potentials, and reversed at −0.45 V, and then stopped at −0.32 V.

11. The method according to claim 9, wherein the electrochemical pre-treatment is performed using a galvanostatic clean performed at a constant current of from $-0.1$ $mA/cm^2$ to $-100$ $mA/cm^2$ and applied for a period of time corresponding to a charge of from $-10$ $mC/cm^2$ to $-10$ $C/cm^2$.

12. The method according to claim 9, wherein the electrochemical pre-treatment is performed using a galvanostatic clean performed at a constant current of from $-0.1$ $mA/cm^2$ to $-100$ $mA/cm^2$ and applied for a period of time corresponding to a charge of from $-100$ $mC/cm^2$ to $-1$ $C/cm^2$.

13. The method according to claim 9, wherein the electrochemical pre-treatment is performed using a galvanostatic clean performed at a constant current of from $-0.1$ $mA/cm^2$ to $-100$ $mA/cm^2$ and applied for a period of time corresponding to a charge of from $-400$ $mC/cm^2$ to $-800$ $mC/cm^2$.

14. The method according to claim 9, wherein the electrochemical pre-treatment is performed using a potentiostatic clean performed at a constant voltage corresponding to a potential of from $-0.27V$ to $-0.8V$, as referenced to a Ag/AgCl reference electrode, which is applied for a period of time corresponding to a charge of from $-10$ $mC/cm^2$ to $-10$ $C/cm^2$.

15. The method according to claim 9, wherein the electrochemical pre-treatment is performed using a potentiostatic clean performed at a constant voltage corresponding to a potential of from $-0.27V$ to $-0.8V$, as referenced to a Ag/AgCl reference electrode, which is applied for a period of time corresponding to a charge of from $-100$ $mC/cm^2$ to $-1$ $C/cm^2$.

16. The method according to claim 9, wherein the electrochemical pre-treatment is performed using a potentiostatic clean performed at a constant voltage corresponding to a potential of from $-0.27V$ to $-0.8V$, as referenced to a Ag/AgCl reference electrode, which is applied for a period of time corresponding to a charge of from $-400$ $mC/cm^2$ to $-800$ $mC/cm^2$.

17. The method according to claim 1, wherein the $HBF_4$-based electrolyte is applied in a form of an aqueous bath having a concentration of $HBF_4$ of from 0.05 wt. % $HBF_4$ (1 ml/L) to 50 wt. % (concentrated).

18. The method according to claim 1, wherein the $HBF_4$-based electrolyte is applied in a form of an aqueous bath having a concentration of $HBF_4$ of from 1 wt. % (20 ml/l) to 10 wt. % (200 ml/L).

19. The method according to claim 1, wherein the $HBF_4$-based electrolyte is applied in a form of an aqueous bath having a concentration of $HBF_4$ of from 2 wt. % (40 ml/L) to 3 wt. % (60 ml/L).

20. The method according to claim 1, wherein one or more additives are added to the $HBF_4$-based electrolyte, wherein the additives are selected from the group consisting of $H_2SO_4$, a wetting agent, a surfactant, a pH controlling agent, and combinations thereof.

* * * * *